US006975551B2

(12) United States Patent
Iwata et al.

(10) Patent No.: US 6,975,551 B2
(45) Date of Patent: Dec. 13, 2005

(54) SEMICONDUCTOR STORAGE, MOBILE ELECTRONIC DEVICE, AND DETACHABLE STORAGE

(75) Inventors: Hiroshi Iwata, Ikoma-gun (JP); Akihide Shibata, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/483,064

(22) PCT Filed: Jul. 9, 2002

(86) PCT No.: PCT/JP02/06926

§ 371 (c)(1), (2), (4) Date: Jan. 7, 2004

(87) PCT Pub. No.: WO03/007305

PCT Pub. Date: Jan. 23, 2003

(65) Prior Publication Data

US 2004/0179405 A1 Sep. 16, 2004

(30) Foreign Application Priority Data

Jul. 10, 2001 (JP) ............................ 2001-209511

(51) Int. Cl.[7] ............................................ G11C 7/00
(52) U.S. Cl. ...................... 365/226; 365/227; 365/229; 365/222
(58) Field of Search ............................... 365/226, 227, 365/229, 222

(56) References Cited

U.S. PATENT DOCUMENTS

| | | | | |
|---|---|---|---|---|
| 4,977,537 | A * | 12/1990 | Dias et al. | 711/106 |
| 5,268,845 | A * | 12/1993 | Startup et al. | 323/275 |
| 5,430,681 | A * | 7/1995 | Sugawara et al. | 365/222 |
| 5,563,839 | A * | 10/1996 | Herdt et al. | 365/227 |
| 5,568,637 | A * | 10/1996 | Moriya | 713/322 |
| 5,610,533 | A * | 3/1997 | Arimoto et al. | 326/33 |
| 5,798,976 | A | 8/1998 | Arimoto | |
| 5,903,507 | A | 5/1999 | Arimoto | |
| 5,917,766 | A * | 6/1999 | Tsuji et al. | 365/201 |
| 6,109,528 | A * | 8/2000 | Kunert et al. | 235/472.01 |
| 6,426,908 | B1 * | 7/2002 | Hidaka | 365/222 |
| 6,487,136 | B2 * | 11/2002 | Hidaka | 365/222 |
| 6,501,300 | B2 * | 12/2002 | Hatae | 326/93 |
| 6,597,615 | B2 * | 7/2003 | Mizugaki | 365/222 |
| 6,667,662 | B2 * | 12/2003 | Saito | 331/1 A |
| 6,691,215 | B1 * | 2/2004 | Mirov et al. | 711/167 |
| 6,744,687 | B2 * | 6/2004 | Koo et al. | 365/226 |
| 6,789,030 | B1 * | 9/2004 | Coyle et al. | 702/77 |
| 2004/0004503 | A1 * | 1/2004 | Fischer et al. | 327/199 |
| 2004/0057315 | A1 * | 3/2004 | Jain | 365/222 |

FOREIGN PATENT DOCUMENTS

| | | | | | |
|---|---|---|---|---|---|
| JP | 406028053 | A | * | 2/1994 | G06F 1/04 |
| JP | 9-167488 | A | | 6/1997 | |
| JP | 11-330273 | A | | 11/1999 | |
| JP | 02000173263 | A | * | 6/2000 | G11C 11/403 |
| JP | 02001216780 | A | * | 8/2001 | G11C 11/407 |

* cited by examiner

*Primary Examiner*—Viet Q. Nguyen
(74) *Attorney, Agent, or Firm*—Birch, Stewart, Kolasch & Birch, LLP

(57) ABSTRACT

While a memory section (1) is in standby mode, a power supply/interruption circuit (2) supplies electric power to a memory section (1) only during periods in which a refresh operation is performed in synchronization with a timing of the refresh operation generated by the clock circuit (3), and interrupts power supply to the memory section (1) during periods in which the refresh operation is not performed. Thus, power consumption of the memory section that performs the refresh operations is suppressed, by which a power consumption reduction of the semiconductor storage device is realized.

14 Claims, 12 Drawing Sheets

SEMICONDUCTOR STORAGE, MOBILE ELECTRONIC DEVICE, AND DETACHABLE STORAGE

CROSS-REFERENCE TO RELATED APPLICATION

This Nonprovisional application claims priority under 35 U.S.C. § 119(a) on Patent Application No. 2001-209511 filed in Japan on Jul. 10, 2001, the entire contents of which are hereby incorporated by reference.

TECHNICAL FIELD

The present invention relates to semiconductor storage devices and, more specifically, to a semiconductor storage device that performs refresh operations for maintaining stored data. Also, the invention relates to a portable electronic equipment and a removable storage device equipped with such a semiconductor storage device.

BACKGROUND ART

In driving volatile memories such as DRAMs (Dynamic Random Access Memories), a refresh operation is performed after a write operation and before loss of stored data so that the stored data is retained. For example, whereas a DRAM discriminates 0's and 1's from each other depending on the amount of electric charges stored in capacitors, the charges stored in the capacitors decrease with time. Therefore, a rewrite operation is done by the refresh operation while the discrimination between 0's and 1's is enabled, thus making it possible to retain the storage.

Conventionally, it has been practiced that power is normally supplied to the memory section that cyclically performs the refresh operation in the standby mode in which none of the write operation, the erase operation and the read operation is performed.

In the prior art, however, there has been a problem that because the power is normally supplied to the memory section even in the standby mode, power consumption would increase, so that reduction of the power consumption of the equipment is inhibited.

DISCLOSURE OF THE INVENTION

Accordingly, an object of the present invention is to provide a semiconductor storage device which can fulfill a reduction of power consumption by suppressing the power consumption of the memory section that performs the refresh operation.

Further, another object of the invention is to provide a portable electronic equipment and a removable storage device equipped with such a semiconductor storage device.

In order to achieve the above object, according to the present invention, there is provided a semiconductor storage device comprising:

a memory section that performs refresh operations;

a power supply/interruption circuit having a function of supplying or interrupting electric power to the memory section; and a terminal for receiving signals from an external clock circuit which generates timings of the refresh operations, wherein the memory section has operation modes of:

an active mode for performing at least one operation out of a write operation, an erase operation and a read operation in response to a request from an external logic circuit, and for performing a refresh operation during a period in which none of those operations is performed; and a standby mode for performing none of a write operation, an erase operation and a read operation based on a request from the external logic circuit but performing refresh operations alone, and wherein while the memory section is in the standby mode, the power supply/interruption circuit supplies electric power to the memory section only during periods in which a refresh operation is performed in synchronization with a timing of the refresh operation generated by the external clock circuit, and interrupts power supply to the memory section during periods in which the refresh operation is not performed.

It is noted that the "memory section" includes memory devices serving as storage units, and peripheral circuits for performing refresh operations on the individual memory devices (which is applicable likewise hereinafter).

In this semiconductor storage device of the present invention, while the memory section is in the standby mode, the power supply/interruption circuit supplies electric power to the memory section only during periods in which a refresh operation is performed in synchronization with a timing of the refresh operation generated by the external clock circuit, and interrupts power supply to the memory section during periods in which the refresh operation is not performed. Therefore, the power consumption of the memory section can be suppressed, so that the power consumption of the semiconductor storage device can be reduced. Further, in a system into which this semiconductor storage device is incorporated, it becomes possible to reduce the power consumption particularly while the system is in the standby state.

Also, according to the present invention, there is provided a semiconductor storage device comprising:

a memory section that performs refresh operations;

a power supply/interruption circuit having a function of supplying or interrupting power to the memory section; and a clock circuit for generating timings of the refresh operations, wherein the memory section has operation modes of:

an active mode for performing at least one operation out of a write operation, an erase operation and a read operation in response to a request from an external logic circuit, and for performing a refresh operation during a period in which none of those operations is performed; and a standby mode for performing none of a write operation, an erase operation and a read operation based on a request from the external logic circuit but performing refresh operations alone, and wherein while the memory section is in the standby mode, the power supply/interruption circuit supplies electric power to the memory section only during periods in which a refresh operation is performed in synchronization with a timing of the refresh operation generated by the clock circuit, and interrupts power supply to the memory section during periods in which the refresh operation is not performed.

In this semiconductor storage device of the present invention, while the memory section is in the standby mode, the power supply/interruption circuit supplies electric power to the memory section only during periods in which a refresh operation is performed in synchronization with a timing of the refresh operation generated by the clock circuit, and interrupts power supply to the memory section during periods in which the refresh operation is not performed. Therefore, the power consumption of the memory section can be suppressed, so that the power consumption of the semiconductor storage device can be reduced. Further, in a system into which this semiconductor storage device is incorporated, it becomes possible to reduce the power consumption particularly while the system is in the standby state. Besides, since this semiconductor storage device is provided with a built-in clock circuit, the semiconductor storage device becomes operable alone without contact with any external equipment. Further, the terminal for receiving the signals from the external clock circuit that generates timings of the refresh operations is no longer necessary. Thus, the number of component parts can be reduced.

In one embodiment of the semiconductor storage device, electric power to the memory section and the clock circuit is supplied from one power supply.

In this embodiment, since the number of power supply units can be reduced, the manufacturing cost and the cost required for the battery in use of the equipment can be reduced.

In one embodiment, the semiconductor storage device further comprises an external power supply terminal for receiving power supply from an external power supply.

In this embodiment, when an external power supply is usable, electric power can be supplied to the memory section or the like via the external power supply terminal from the external power supply, so that power consumption of the internal power supply can be suppressed to a minimum. Therefore, it becomes possible to downsize the device from the design point of view by reducing the capacity of the internal power supply.

In one embodiment, the semiconductor storage device further comprises a secondary battery which is charged with electric power supplied from the external power supply.

In this embodiment, the secondary power supply is charged with electric power supplied from the external power supply, and electric power is supplied to the memory section or the like from this secondary power supply. Since the charging to the secondary power supply can be done from time to time, the possibility that the power supply is exhausted and the storage of the memory section is dissipated can be prevented. Also, since the charging to the secondary power supply can be done from time to time, the capacity of this secondary power supply can be reduced from the design point of view. As a result of this, it becomes possible to downsize the semiconductor storage device.

In one embodiment of the semiconductor storage device, the memory section has a memory device which retains storage for not less than a time T without any refresh operation, the clock circuit or the external clock circuit generates timings of the refresh operations at a cycle shorter than the time T, and the time T is not less than $1\times10^{-3}$ second.

In this embodiment, since the interval of refresh operations is enough longer than the time required for the refresh operation, the power consumption reduction effect with the memory section in the standby mode can be sufficiently fulfilled. Therefore, the power consumption of the semiconductor storage device can be sufficiently reduced.

In one embodiment of the semiconductor storage device, the clock circuit is formed of a complementary circuit which uses field effect transistors, and an absolute value of a power supply voltage with which the clock circuit is driven is smaller than an absolute value of a threshold value of the field effect transistors.

In this embodiment, since the power supply voltage with which the clock circuit is driven is lower than the threshold value of the field effect transistors (its absolute value for P-type field effect transistors) constituting the complementary circuit, the power consumption of the clock circuit can be reduced to a large extent. Therefore, it becomes possible to downsize the device from the design point of view by reducing the capacity of the power supply. Otherwise, the possibility that the power supply is exhausted and the storage of the memory section is dissipated can be prevented.

In one embodiment of the semiconductor storage device, the memory section has a memory device which comprises a field effect transistor having a conductor film or semiconductor film as its floating gate, and an insulating film thickness between the conductor film or semiconductor film and a channel region of the field effect transistor is less than 10 nm, or an insulating film thickness between the conductor film or semiconductor film and a gate electrode of the field effect transistor is less than 10 nm.

In this embodiment, since the insulating films that sandwich the floating gate of the field effect transistor are thin in thickness, the operating voltage can be lowered. Therefore, it becomes possible to reduce the power consumption during the memory operation so that deterioration of the memory devices can be reduced. Furthermore, since the insulating films are thin in thickness, the potential barrier becomes thin as well, so that write and erase operations can be made faster.

In one embodiment of the semiconductor storage device, the memory section has a memory device formed of a field effect transistor in which discrete dots formed of a conductor or semiconductor are used as a floating gate.

In this embodiment, since the floating gate is provided by discrete dots, the tolerance to failures due to pinholes of the insulating films or the like is increased.

In one embodiment of the semiconductor storage device, the memory section has a memory device of a field effect transistor type having a floating gate, and the floating gate is formed of a composite of a conductor film or semiconductor film and discrete dots of a conductor or semiconductor.

In this embodiment also, since the semiconductor storage device is operated on a low power supply voltage, it becomes possible to reduce the power consumption during the memory operation so that deterioration of the memory devices can be reduced.

Further, according to the present invention, there is provided a portable electronic equipment which comprises the semiconductor storage device as defined in the above description.

In this portable electronic equipment of the present invention, while the portable electronic equipment is in the standby mode, that is, while the memory section is in the standby mode, the power consumption of the memory section can be largely reduced. Therefore, it becomes possible to largely prolong the life of the battery mounted on this portable electronic equipment.

Further, according to the present invention, there is provided a removable storage device comprising:

a base member which is removably mounted on an electronic equipment, wherein on the base member, the semiconductor storage device as defined in the above description is mounted, and a terminal for transmitting and receiving data with the electronic equipment is provided.

In this removable storage device of the present invention, data transmitted from the electronic equipment can be received via the terminal and stored in the memory section, while data stored in the memory section can be transmitted to the electronic equipment via the terminal.

In this removable storage device, since the power consumption of the memory section can be largely reduced while the memory section is in the standby mode, it becomes possible to prolong the life of the battery mounted on the base member to a large extent. Furthermore, when the removable storage device of the present invention is used in common among a plurality of units of electronic equipment, data sharing among the plurality of units of electronic equipment can be implemented.

DESCRIPTION OF THE INVENTION (First Embodiment)

Figure 1:
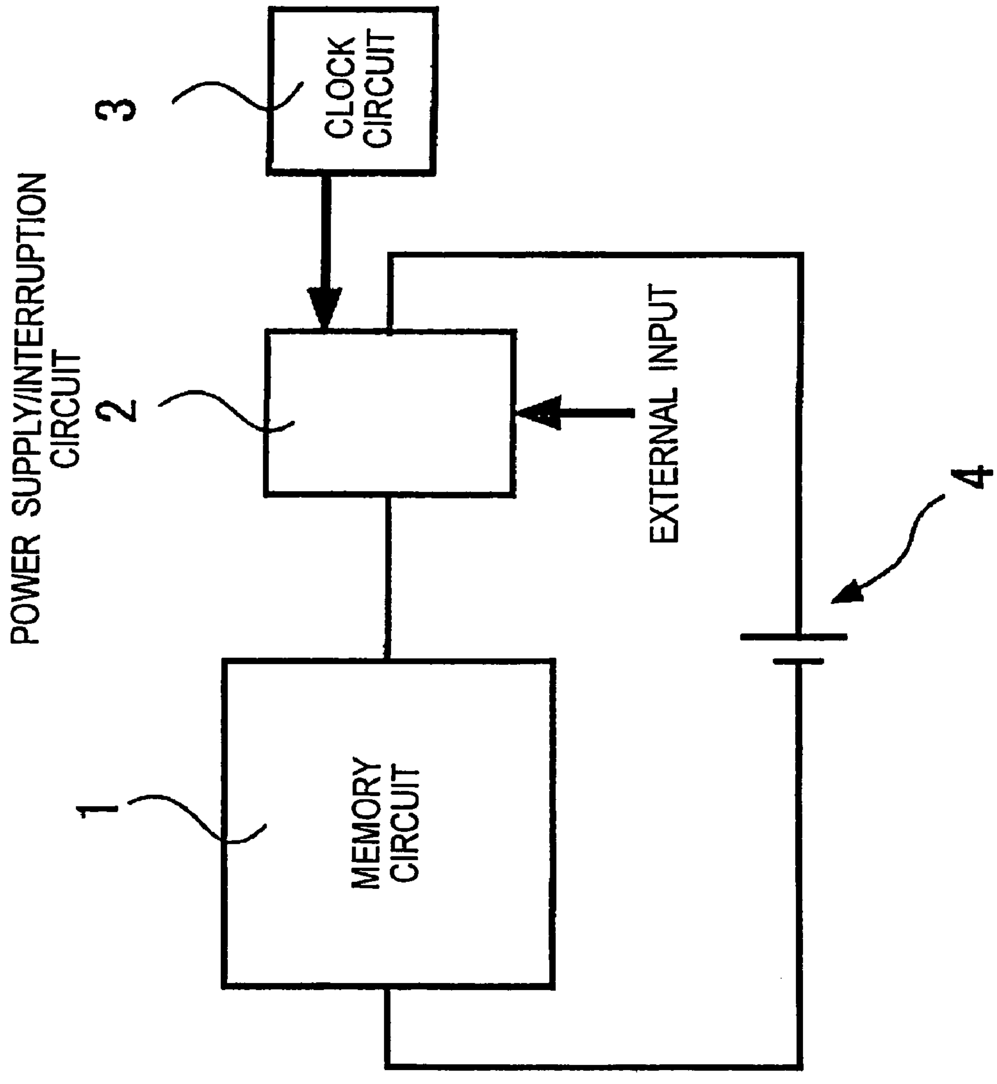
FIG. 1 is a view showing the basic concept of a semiconductor storage device of a first embodiment of the invention.

A semiconductor storage device of a first embodiment of the present invention is described with reference to FIGS. 1 and 2.

This embodiment relates to a semiconductor storage device in which with the memory section in the standby mode, power supply to the memory section is halted during periods in which the refresh operation is not performed.

First, the basic concept of the semiconductor storage device of this embodiment is explained with reference to FIG. 1. This semiconductor storage device has a memory circuit 1 as a memory section, a power supply/interruption circuit 2, a clock circuit 3 and a power supply 4. It is noted that in FIG. 1, an external logic circuit that requires the memory circuit 1 to take a later-described active mode or standby mode, or a data bus that connects this external logic circuit and the memory circuit 1 to each other, and the like are omitted.

The memory circuit 1 includes a memory cell array part and a peripheral circuit part. Memory cells constituting the memory cell array are formed from memory devices that require refresh operations to retain stored data. Between the power supply 4 and the memory circuit 1 is interposed a power supply/interruption circuit 2 implemented by a switch which supplies or halts electric power to the memory circuit 1. To the power supply/interruption circuit 2 is connected a clock circuit 3 which generates timings for the refresh operations. A switching operation between power supply and interruption by the power supply/interruption circuit 2 is controlled by the clock circuit 3 or an external input line. It is noted that the power supply/interruption circuit 2 may be formed either on a semiconductor chip other than that of the memory circuit 1 or on the same chip. Also, in FIG. 1, the power supply/interruption circuit 2 is provided on a high-voltage (VDD) side of power supply as viewed from the memory circuit, but may be provided instead on a low-voltage (GND) side, its position not being limitative only if the switching between power supply and interruption can be fulfilled. The clock circuit 3 may be either contained in this semiconductor storage device or provided outside the semiconductor storage device. When the clock circuit is provided outside, the semiconductor storage device only has to be provided with a terminal for receiving signals generated by the clock circuit. When this semiconductor storage device is provided with a built-in clock circuit, the semiconductor storage device becomes operable alone without contact with any external equipment. Further, the terminal for receiving the signals from the clock circuit is no longer necessary, so that the number of component parts can be reduced.

The memory circuit 1 has operation modes composed of an active mode and a standby mode. While the memory circuit 1 is in the active mode, write operation, erase operation, read operation and the like are performed on the memory circuit 1 from an external logic circuit. Naturally, refresh operation is performed in a cycle shorter than the storage retention time of the memory devices constituting the memory cell array part. Meanwhile, while the memory circuit 1 is in the standby mode, requests for write operation, erase operation, read operation and the like are not made to the memory circuit 1 from the external logic circuit. That is, in the standby mode, the memory circuit 1 cyclically repeats the refresh operation alone.

In the case where the memory circuit 1 is in the active mode, that is, where the write operation, erase operation, read operation and the like are performed on the memory circuit 1 from the external logic circuit, the external logic circuit transmits a control signal through the external input line to the power supply/interruption circuit 2, and in response to the control signal, the power supply/interruption circuit 2 supplies electric power to the memory circuit 1. Meanwhile, in the case where the memory circuit 1 is in the standby mode, the power supply/interruption circuit 2 supplies power to the memory circuit 1 only when the clock circuit 3 has issued timings for refresh operations, and interrupts the power during other periods. Therefore, the power consumption during the periods in which the memory circuit 1 is in the standby mode can be reduced.

Figure 2:
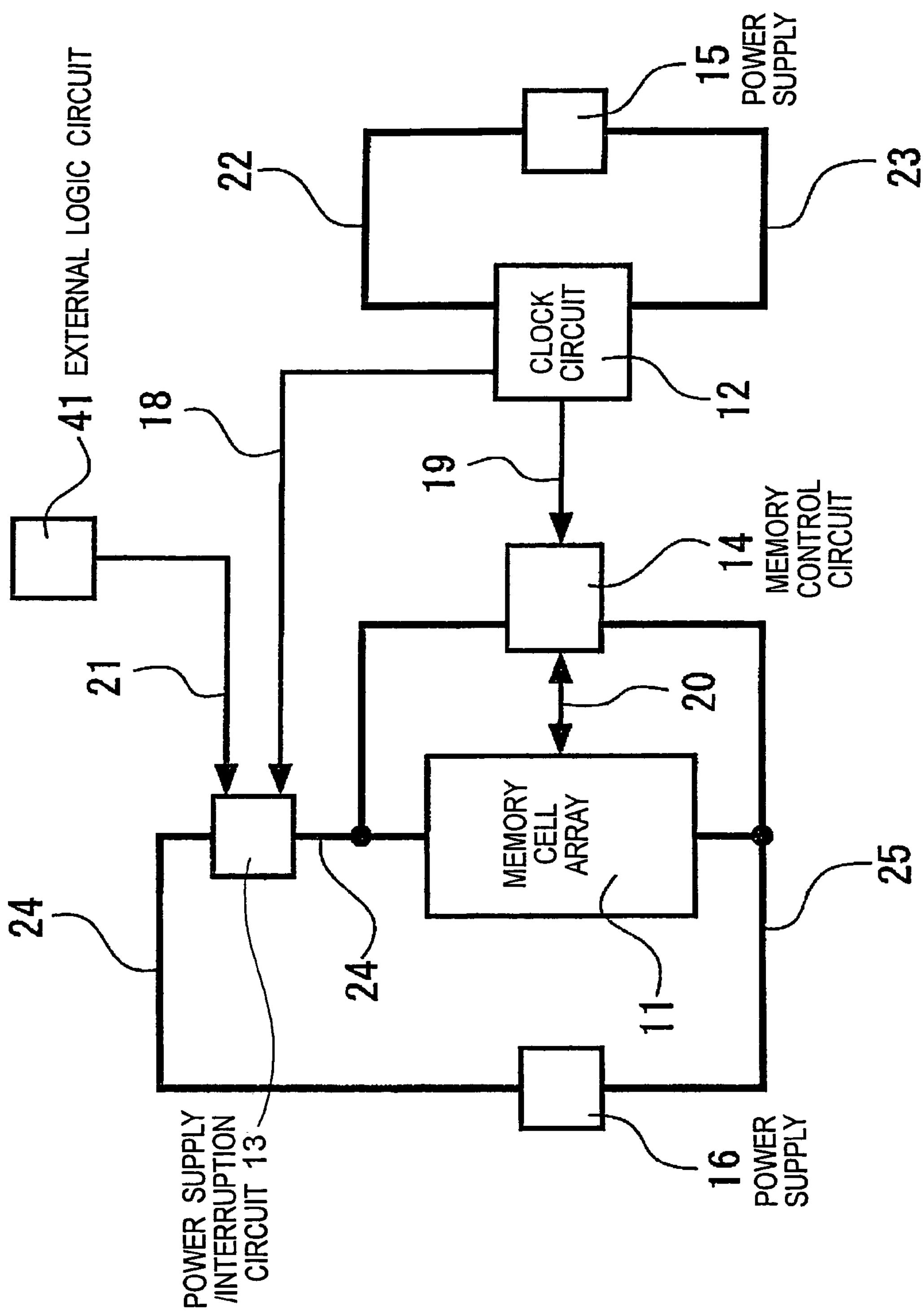
FIG. 2 is a view showing the construction of the semiconductor storage device of the first embodiment of the invention.

FIG. 2 shows in more detail the construction of the semiconductor storage device of this embodiment. The memory circuit 1 as a memory section in FIG. 1 corresponds to a memory cell array 11 and a memory control circuit 14 connected to the memory cell array 11 via a signal line 20 in FIG. 2. It is noted that a bus line that connects the external logic circuit, such as an MPU (Microprocessor Unit), and the memory section to each other, and the like are omitted. The memory cell array 11 is made up of a plurality of memory devices that are of a type requiring refresh operations and that are arranged in a matrix shape. The memory control circuit 14, which includes a circuit for controlling the memory cell array 11, has a function of refreshing the memory cell array 11. To the memory cell array 11 and the memory control circuit 14, power is supplied from a power supply 16 (which may be a battery) via a ground line 25 and a power line 24. On the way of the power line 24, however, is interposed a power supply/interruption circuit 13 implemented by a switch which supplies or halts electric power to the memory cell array 11 and the memory control circuit 14. A clock circuit 12 has a function of, for example, issuing signals at constant time intervals or halting signals at constant time intervals. The clock circuit 12 is connected with the power supply/interruption circuit 13 and the memory control circuit 14 via a signal line 18 and a signal line 19, respectively. To the clock circuit 12, power is supplied from a power supply 15 (which may be a battery) via a ground line 23 and a power line 22. Besides, a signal line 21 derived from an external logic circuit 41 such as an MPU is connected to the power supply/interruption circuit 13.

Next, the operation method of the semiconductor storage device of this embodiment is explained. First, operations in the case where the memory section is in the standby mode, that is, where neither rewrite nor read of stored data is not performed are explained. It is assumed that each of the memory devices constituting the memory cell array 11 is incapable of retaining the stored data unless a refresh operation is performed in a cycle T or less. In this case, the clock circuit 12 issues signals to the signal line 18 and the signal line 19 at a cycle of T or less. The signal transmitted to the signal line 18 reaches the power supply/interruption circuit 13, turning the switch into an ON state. With the power supply/interruption circuit 13 in the ON state, power is supplied to the memory cell array 11 and the memory control circuit 14. The signal transmitted to the signal line 19 reaches the memory control circuit 14, where the memory control circuit 14, receiving this signal, performs a refresh operation on the memory cell array 11. Thus, each memory device is enabled to retain the stored data. Since no signal is issued from the clock circuit 12 in the period between one refresh operation and another refresh operation, the power supply/interruption circuit 13 halts the power supply to the memory cell array 11 and the memory control circuit 14. Otherwise, the operations of the clock circuit 12 and the power supply/interruption circuit 13 may also be as follows. The clock circuit 12 temporarily halts the signal to the signal line 18 in a cycle of T or less, and the power supply/interruption circuit 13 keeps an ON state while the signal is halted. In such a case also, each memory device is enabled to retain the stored data. Naturally, since a signal is issued from the clock circuit 12 in the period between one refresh operation and another refresh operation, the power supply/interruption circuit 13 halts the power supply to the memory cell array 11 and the memory control circuit 14. Thus, during the periods in which the memory section is in the standby mode, power consumption of the memory section can be reduced.

In the above explanation, although the timings at which the clock circuit 12 issues (or halts) signals to the signal lines 18 and 19 may be concurrent with each other, yet it is preferable that a specified time after a signal is issued (or halted) to the signal line 18, a signal is issued to the signal line 19. In this case, after the elapse of the specified time since the switch of the power supply/interruption circuit 13 has turned to the ON state, the signal reaches the memory control circuit 14. Therefore, the voltage fed from the power supply/interruption circuit 13 to the memory control circuit 14 is sufficiently stabilized before the memory control circuit 14 receives the signal from the clock circuit 12, so that the operation stability of the memory control circuit 14 is improved. Besides, before the memory control circuit 14 receives the signal from the clock circuit 12, the memory control circuit 14 is allowed to perform initialization operation and the like.

Next, operations in the case where the memory section is in the active mode, that is, where rewrite or read of stored data is performed are explained. With the memory section in the active mode, the external logic circuit 41 such as MPU transmits a control signal to the power supply/interruption circuit 13 through the signal line 21, and in response to the control signal, the power supply/interruption circuit 13 supplies electric power to the memory cell array 11 and the memory control circuit 14. Therefore, the power supply/interruption circuit 13 supplies power to the memory cell array 11 and the memory control circuit 14 regardless of the presence or absence of the signal from the clock circuit 12.

In addition, in order that the power consumption reduction effect in the case where the memory section is in the standby mode is fulfilled enough, it is preferable that the cycle of refresh operations is longer. In order to lengthen the refresh cycle, each of the memory devices constituting the memory cell array 11 has to be capable of retaining storage without the refresh operation for longer time. Here is taken a case where with 4096 logical word lines, a refresh is done at a minimum cycle of 100 ns. The refresh operation in this case is assumed to be of the concentrated refresh method that all the logical word lines are refreshed successively. In this case, the refresh operation request a time duration of about 0.4 ms. Accordingly, the interval of refresh operations is preferably sufficiently longer than 0.4 ms, for example, 1 ms ($1\times10^{-3}$ sec.) or more. In this case, power supply to the memory cell array 11 and the memory control circuit 14 can be halted for a period of about 0.6 ms per cycle. In order that the power consumption reduction effect becomes remarkable, the interval of refresh operations is more preferably 10 ms ($1\times10^{-2}$ sec.) or more. As the refresh method, naturally, the concentrated refresh method is preferred to the distributed refresh method.

According to the semiconductor storage device of this embodiment, while the memory section is in the standby mode, i.e., while neither rewrite nor read of stored data is not performed, the power supply to the memory cell array 11 and the memory control circuit 14 is halted during the periods in which the refresh operation is not performed. Therefore, the power consumption of the semiconductor storage device can be reduced. Further, in a system into which this semiconductor storage device is incorporated, it becomes possible to reduce the power consumption particularly while the system is in the standby state.

(Second Embodiment)

A semiconductor storage device of a second embodiment of the present invention is described with reference to FIG. 3. This embodiment differs from the first embodiment in that the power supply 15 for the clock circuit 12 and the power supply 16 for the memory cell array 11 and the memory control circuit 14 as shown in FIG. 2 are integrated into one power supply 17. It is noted that the same constituent members as those of FIG. 2 are designated by the same reference numerals. The operation method is the same as in the first embodiment.

According to the semiconductor storage device of this embodiment, the same working effects as in the first embodiment are produced and, besides, the number of power supplies can be reduced, so that the manufacturing cost and the cost required for the battery in use of the equipment can be reduced.

(Third Embodiment)

A semiconductor storage device of a third embodiment of the present invention is described with reference to FIG. 4. This embodiment differs from the second embodiment in that the power supply to the memory cell array 11 and the memory control circuit 14 is performed not only from the internal power supply 17 but also from an unshown external power supply. It is noted that the same constituent members as those of FIG. 3 are designated by the same reference numerals.

The semiconductor storage device of this embodiment is provided with a pair of external power supply terminals 29, 30 for receiving power supply from the external power supply. The external power supply terminal 29 is connected to a power supply/interruption circuit 32 through a power line 26, and the external power supply terminal 30 is connected to a ground line 23. To the memory cell array 11 and the memory control circuit 14, as in the second embodiment, a power line 22 derived from the power supply 17 is connected via the power supply/interruption circuit 32 and, besides, a ground line 23 derived from the power supply 17 is connected. Also, a signal terminal 31 derived from an external logic circuit such as an MPU is connected to the power supply/interruption circuit 32 through a signal line 28. Also, a clock circuit 12 for generating timings of refresh operations is connected to the power supply/interruption circuit 32 through a signal line 18. A switching operation between power supply and interruption by the power supply/interruption circuit 32 is controlled through the signal line 28 by the external logic circuit or through the signal line 18 by the clock circuit 12.

The operation method of the semiconductor storage device of this embodiment is as follows. In the case where the memory section is in the standby mode, power is supplied to the memory cell array 11 and the memory control circuit 14 by the method described in the first embodiment only when the refresh operation is done. In this case, with an external power supply usable, the power supply/interruption circuit 32 is so controlled that the power is supplied to the memory cell array 11 and the memory control circuit 14 from the external power supply, while with an external power supply unusable, the power supply/interruption circuit 32 is so controlled that the power is supplied from the internal power supply 17. Also, in the case where the memory section is in the active mode, a signal is transmitted from the external logic circuit such as an MPU to the power supply/interruption circuit 32 through the signal line 28 so that the power from the external power supply is supplied. Accordingly, the power supply/interruption circuit 32 supplies the power derived from the external power supply to the memory cell array 11 and the memory control circuit 14 regardless of the presence or absence of a signal from the clock circuit 12.

In addition, as described in the first embodiment, in order that the power consumption reduction effect with the memory section in the standby mode is sufficiently fulfilled, the cycle of refresh operations is preferably a longer one, e.g., 1 ms ($1\times10^{-3}$ sec.) or more, and more preferably, 10 ms ($1\times10^{-2}$ sec.) or more.

In this connection, if an external power supply is usable, it is also possible that the power supply 17 is implemented by a secondary battery and the power supply/interruption circuit 32 has a function of supplying power to the power supply 17 so that the power supply 17 can be charged by the external power supply. In this case, the possibility that the power supply 17 is exhausted and the storage of the memory section is dissipated can be prevented. Also, from the design point of view, since the power supply 17 can be lowered in capacity, it becomes possible to downsize the semiconductor storage device.

According to the semiconductor storage device of this embodiment, the same working effects as those of the semiconductor storage device of the first embodiment are produced. Furthermore, when an external power supply is usable, since the power can be supplied from the external power supply to the memory section, power consumption of the internal power supply can be suppressed to a minimum. Thus, it becomes possible to downsize the device from the design point of view by reducing the capacity of the internal power supply.

(Fourth Embodiment)

Figure 5:
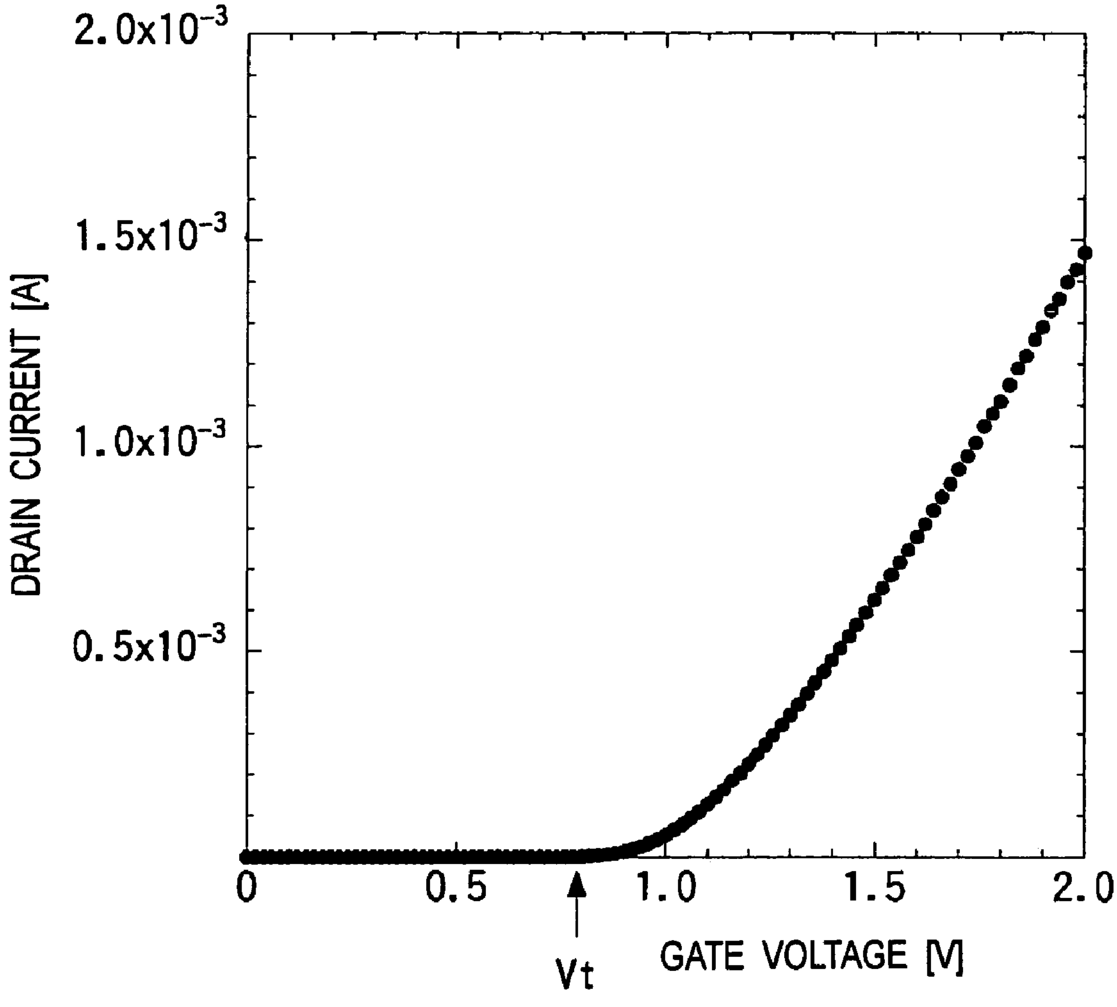
FIG. 5 is a graph showing drain current versus gate voltage characteristics of an N-channel type MOSFET, and explaining a fourth embodiment of the invention.
Figure 6:
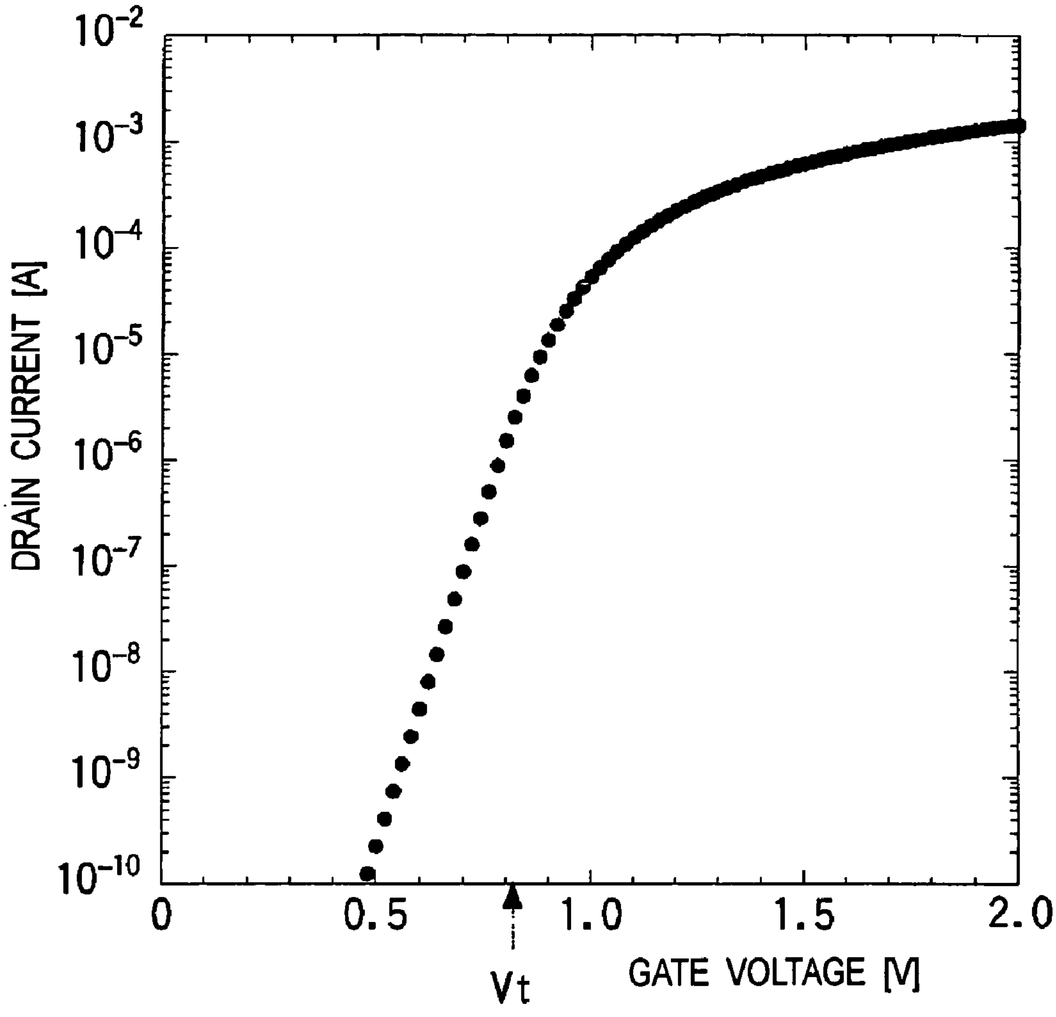
FIG. 6 is a graph logarithmically profiling the drain current in FIG. 5 and explaining the fourth embodiment of the invention.

A fourth embodiment of the present invention is described with reference to FIGS. 5 and 6. This embodiment is an embodiment in which the power consumption of the clock circuit of the foregoing first to third embodiments is reduced to a large extent.

In the foregoing embodiments, the clock circuit 12 has to be normally operating in order to generate signals for performing the refresh operations of the memory section. Therefore, it is important to reduce the power consumption of the clock circuit 12. Accordingly, the clock circuit 12 is preferably implemented by a complementary MOS (CMOS) circuit that involves smaller power consumption. Further, for reduction of the power consumption, it is effective to set the power supply voltage smaller than the threshold (its absolute value) of the MOSFET. In this connection, the threshold value is referenced by a voltage of the source electrode. As an example, a case is discussed in which a MOSFET having characteristics shown in FIGS. 5 and 6. FIG. 5 shows drain current versus gate voltage characteristics of an N-channel type MOSFET (with a gate width of 10 $\mu$m) in a linear scale, and explaining a fourth embodiment of the invention, and FIG. 6 logarithmically profiles the drain current of the longitudinal axis in FIG. 5. The threshold value of this MOSFET is about 0.82 V, and a power supply voltage (e.g., 2 V) enough larger than this threshold value is used in ordinary circuits. It is noted that the threshold value is defined as a gate voltage resulting when a drain current of $1\times10^{-7}$ A flows for each gate width of 1 $\mu$m.

However, in this embodiment, the power supply voltage of the clock circuit 12 is characterized by being smaller than the foregoing threshold value. For example, the power supply voltage can be set to 0.7 V. According to FIG. 5, when the gate voltage is 0.7 V, the drain current is about $1\times10^{-7}$ A, which is incommensurably larger than the off-current (a drain current with a gate voltage of 0 V) Similarly, with a P-channel type MOSFET set to a threshold value of about −0.8 V (referenced by the voltage of the source electrode), constructing a complementary circuit of these N-channel and P-channel type MOSFETs makes it sufficiently implementable to perform logical operations. However, high-speed operations are impossible because of the small absolute value of the drain current, but it does not matter because the clock circuit 12 has only to operate at low speed.

According to the semiconductor storage device of this embodiment, the clock circuit is formed of a complementary circuit using FETs. Further, since the power supply voltage for driving the clock circuit is characterized by being smaller than the threshold value of FETs (its absolute value for P-type FET) constituting the complementary circuit, the power consumption of the clock circuit can be reduced to a large extent. Accordingly, it becomes implementable to downsize the device by reducing the capacity of the power supply. Otherwise, the possibility that the power supply (battery) is exhausted and the storage of the memory section is dissipated can be prevented.

(Fifth Embodiment)

A fifth embodiment of the present invention is described with reference to FIGS. 7–11. This embodiment shows concrete examples of memory devices constituting each memory cell array 11 in the foregoing embodiments.

As the memory devices constituting the memory cell array 11, volatile memory devices such as DRAMs can be used. Otherwise, those which are FET type memory devices and which need the refresh operation are also usable.

Figure 7:
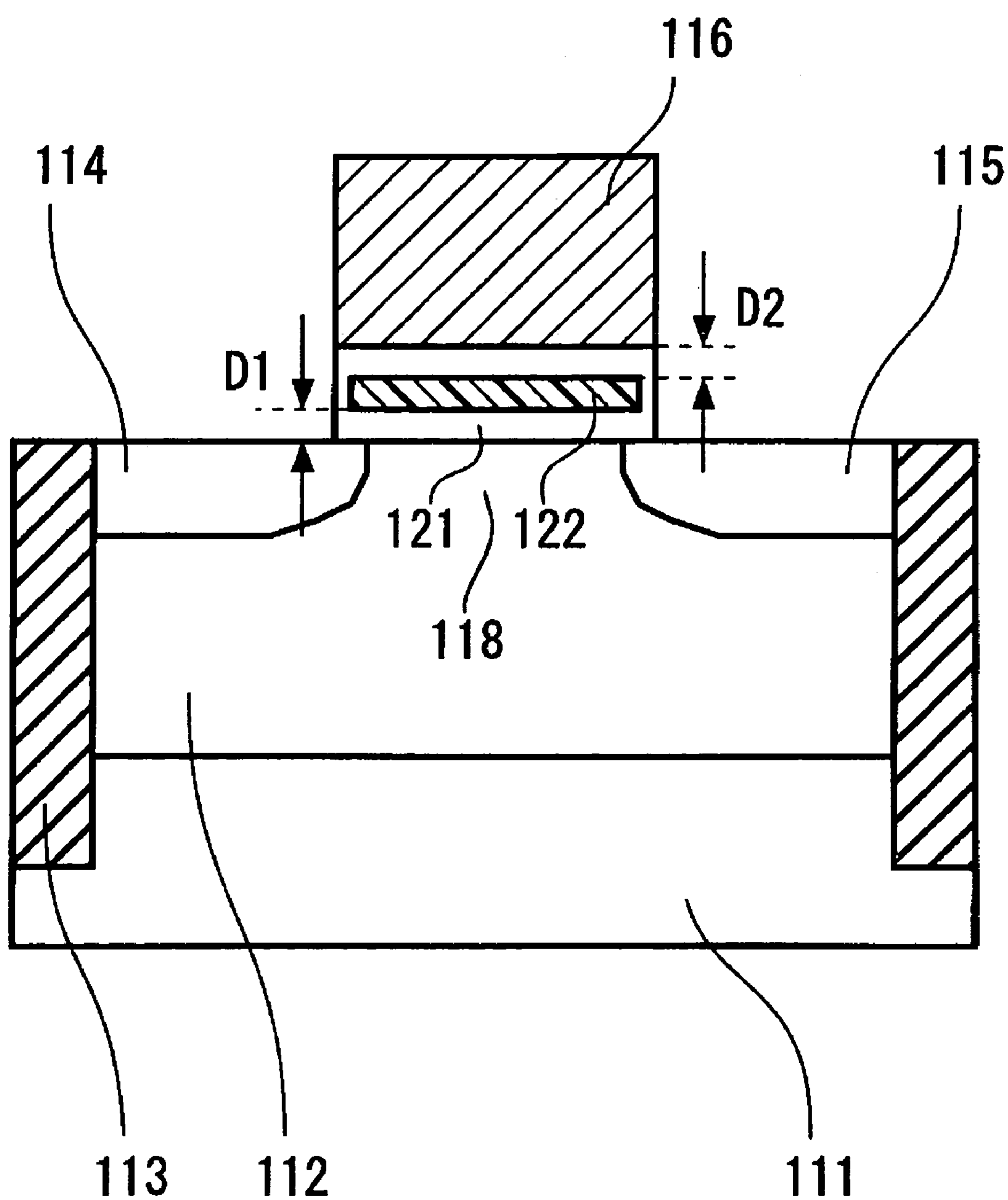
FIG. 7 is a schematic sectional view of a first example of a memory device of a fifth embodiment of the invention.

FIG. 7 shows a first example of an FET type memory device adopted in this embodiment. This FET type memory device has a semiconductor substrate 111, a P-type well region 112, a source region 114 and a drain region 115 which are provided on the surface of the P-type well region 112 at a spacing from each other, and a gate electrode 116 formed on a channel region 118 between the source region 114 and the drain region 115. Reference numeral 113 denotes a device isolation region. A gate insulator 121 is formed between the channel region 118 and the gate electrode 116, and a floating gate 122 formed of a conductor film or semiconductor film is present within the gate insulator 121. It is assumed here that the thickness of a portion of the gate insulator 121 present between the floating gate 122 and the channel region 118 is D1, and that the thickness of a portion of the gate insulator 121 present between the floating gate 122 and the gate electrode 116 is D2. If both D1 and D2 are not less than 10 nm, a storage retention time of not less than 10 years can be obtained, hence a substantially nonvolatile memory. If either D1 or D2 is less than 10 nm, then the storage retention time becomes shorter, where the refresh operation becomes necessary. In the case where D1<D2, electric charges are put into and out of the floating gate 122 from the channel 118 side, while in the case where D1>D2, electric charges are put into and out of the floating gate 122 from the gate electrode 116 side, but either case is allowable. Such memory devices, when used for the semiconductor storage device of the present invention, makes it possible to largely reduce the power consumption while the memory section is in the standby mode. Further, thinning the insulator films D1, D2 allows the operating voltage to be lowered, where the power consumption during the memory operation is also reduced, so that deterioration of the devices can be reduced. Furthermore, thinned insulator films D1, D2 makes the potential barrier thinned as well, so that write and erase operations become faster.

Figure 8:
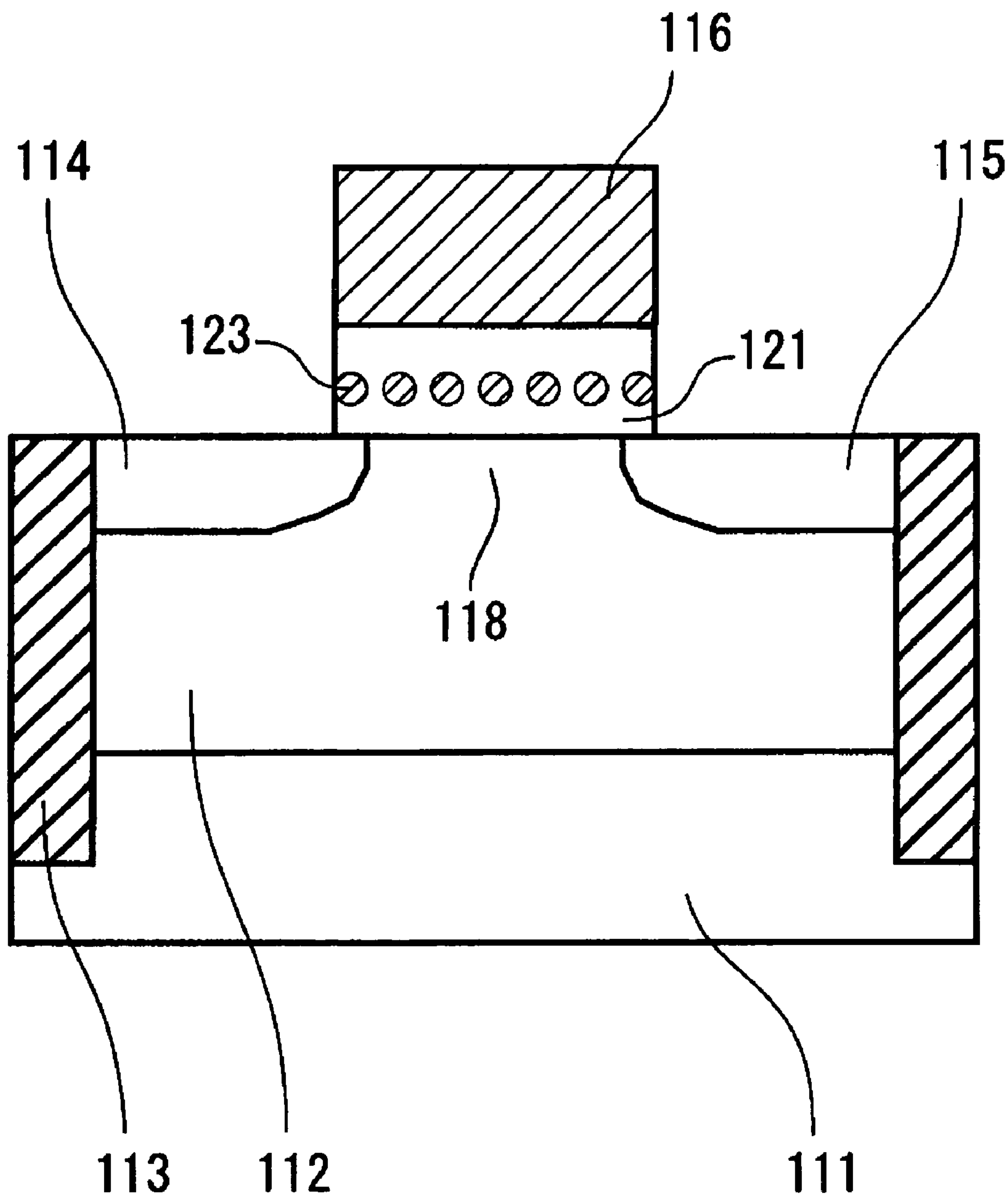
FIG. 8 is a schematic sectional view of a second example of the memory device of the fifth embodiment of the invention.

FIG. 8 shows a second example of the FET type memory device adopted in this embodiment. This example differs from the first example in that a floating gate 123 is implemented by particles formed of a conductor or semiconductor (hereinafter, referred to as “discrete dots”). Memories in which discrete dots are used as the floating gate 123 have been reported in academy or the like that those are capable of low voltage operations and their storage retention time is several seconds to several days or so. Therefore, such memory devices, when used for the semiconductor storage device of the present invention, makes it possible to largely reduce the power consumption while the memory section is in the standby mode. Also, providing the floating gate 123 as discrete dots produces a further effect of increasing the tolerance to failures due to pinholes of the gate insulator 121.

Figure 9:
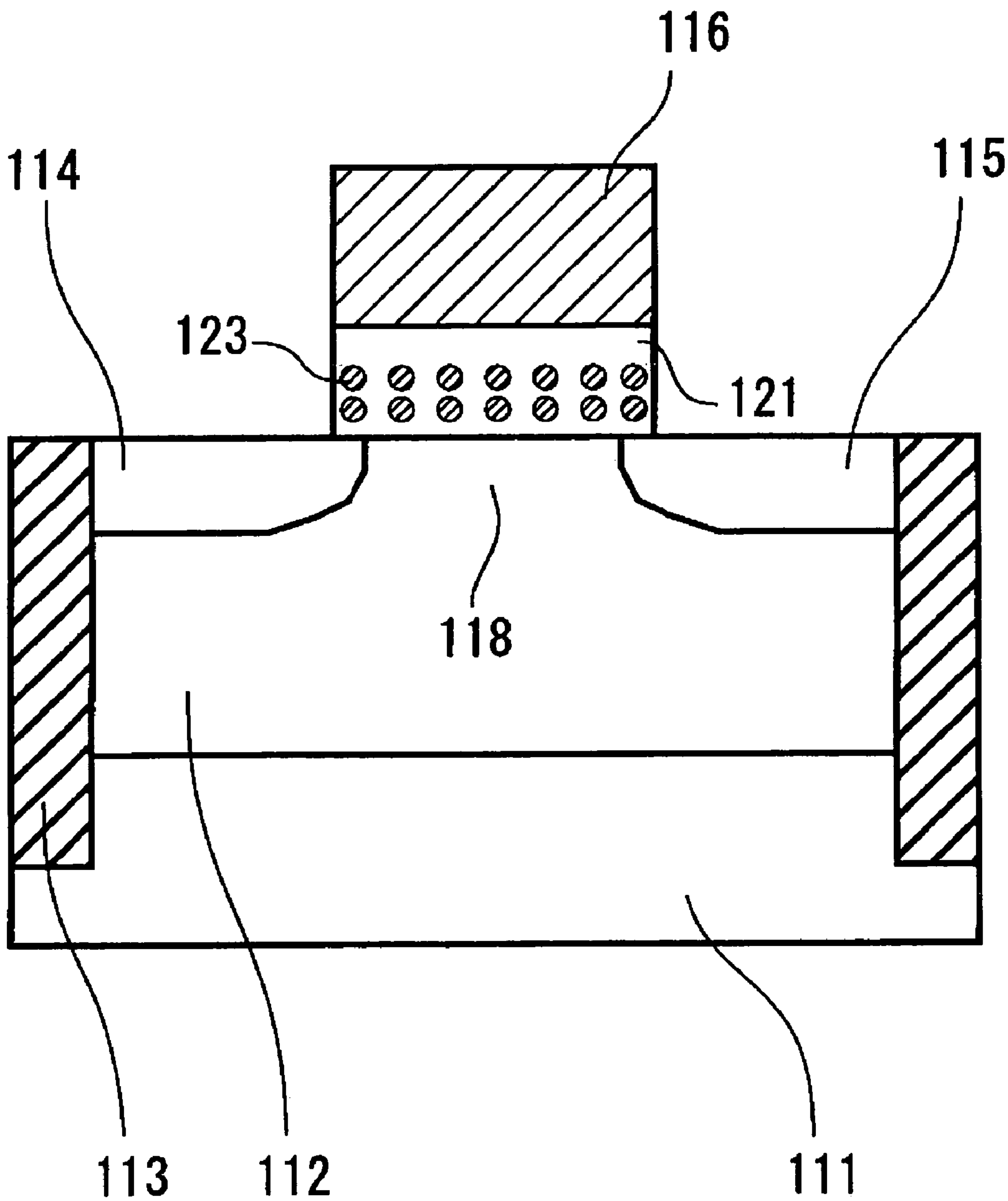
FIG. 9 is a schematic sectional view of a third example of the memory device of the fifth embodiment of the invention.

FIG. 9 shows a third example of the FET type memory device adopted in this embodiment. This example differs from the second example in that discrete dots constituting the floating gate 123 are formed so as to be isolated into two layers in the gate insulator 121. It is known that by the discrete dots being formed so as to be isolated into two layers in the gate insulator 121, there appears a memory effect by the coulomb blockade phenomenon. With the use of this phenomenon, direct tunneling of electric charges becomes implementable, so that lower-voltage operations become achievable. Also, the use of the direct tunneling phenomenon makes it implementable to achieve higher-speed write and erase operations. Furthermore, since the gate insulator 121 can be made even thinner, the short-channel effect is suppressed and memory devices can be made further minute.

Figure 10:
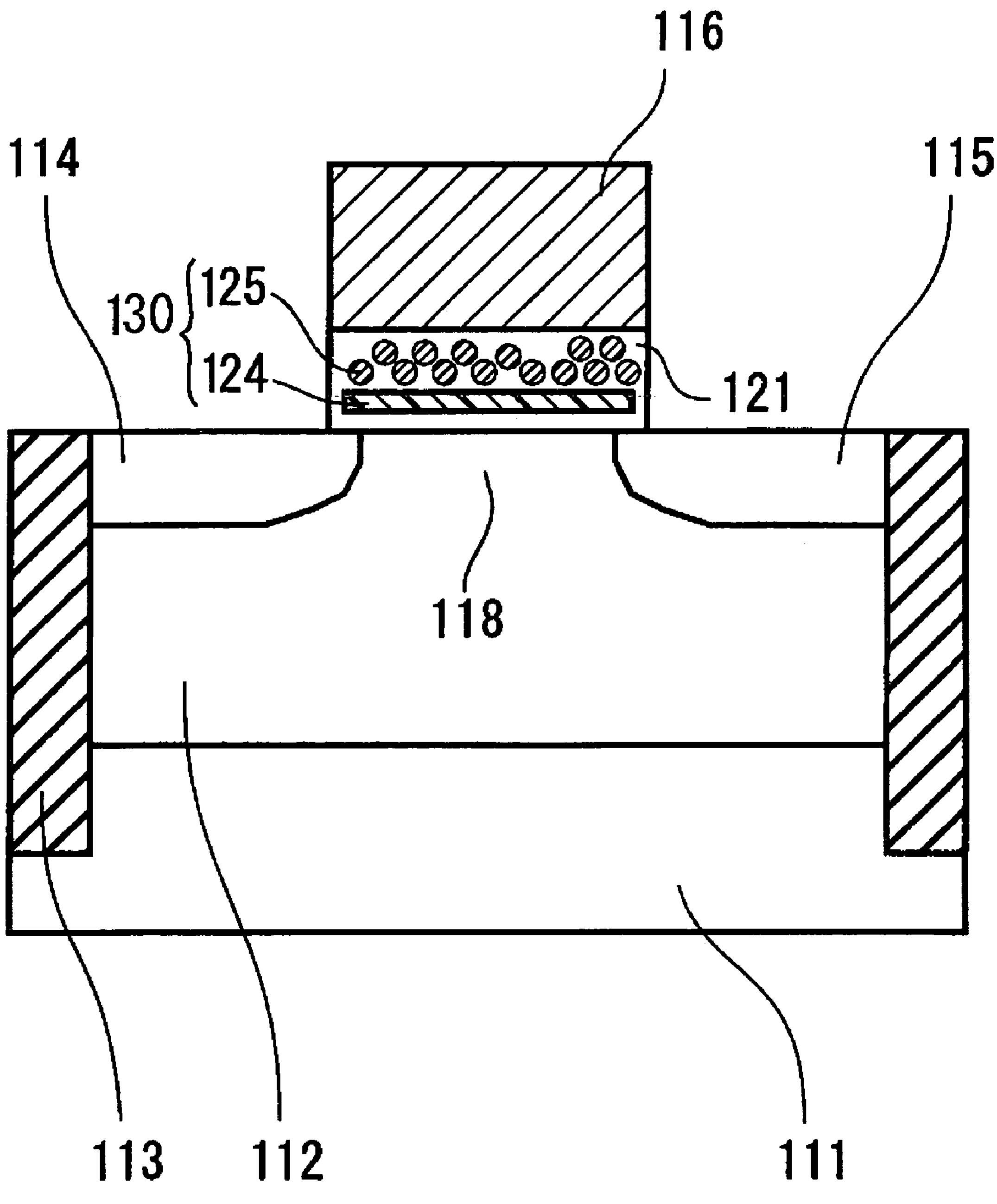
FIG. 10 is a schematic sectional view of a fourth example of the memory device of the fifth embodiment of the invention.
Figure 11:
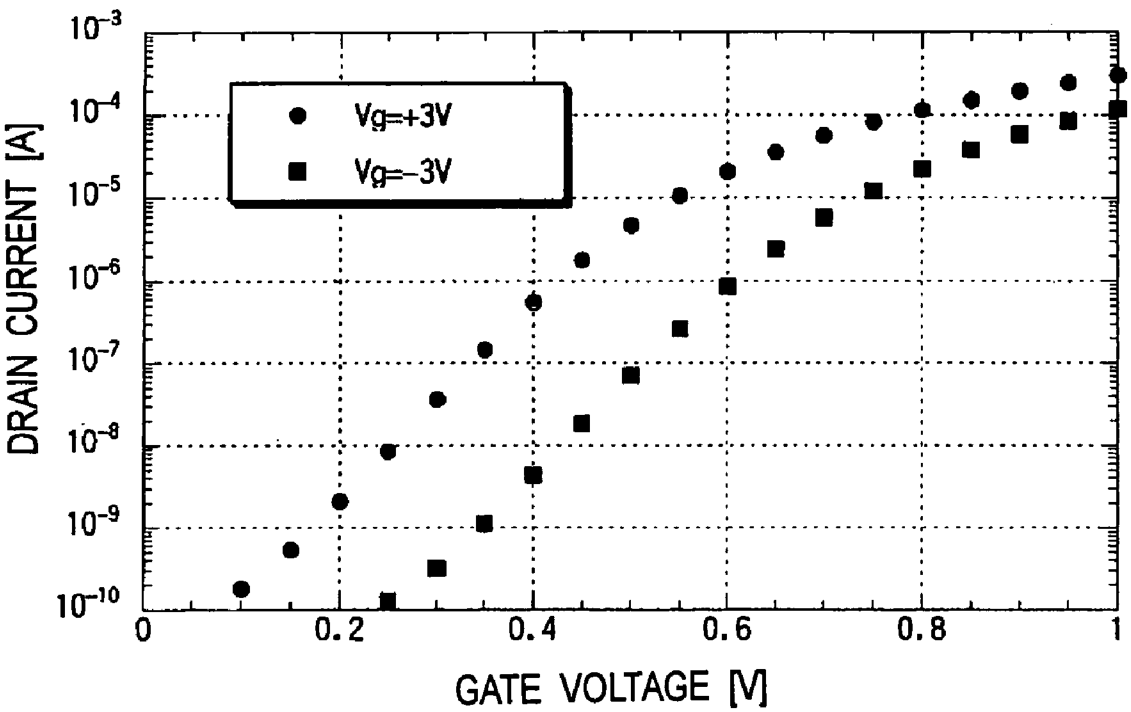
FIG. 11 is a graph representing hysteresis of the fourth example of the memory device of the fifth embodiment of the invention.

FIG. 10 shows a fourth example of the FET type memory device adopted in this embodiment. In this fourth example, a floating gate 130 is formed of a composite of a conductor film or semiconductor film 124 and discrete dots. 125. With the construction shown in FIG. 9 as well, it has been found that the memory effect appears at low voltage. FIG. 11 shows drain current versus gate voltage characteristics after an application of ±3 V to the gate electrode in an FET of the construction shown in FIG. 10, showing a clear hysteresis. Such memory devices as well, when used for the semiconductor storage device of the present invention, makes it possible to largely reduce the power consumption while the memory section is in the standby mode.

As the FET type memory devices, for example, ones using $Si_3N_4/SiO_2$ film or $SiO_2/Si_3N_4/SiO_2$ film (ONO film) are available, and devices using these are exemplified by MNOS, SNOS and SONOS. Although the silicon nitride film is expressed as $Si_3N_4$ and the silicon oxide film is expressed as $SiO_2$ in this case, yet these are not intended to limit the component ratio for individual elements. Further available are those using a ferroelectric memory film having hysteresis characteristics instead of a film that traps electric charges. These memory devices also, with the memory film thinned as an example, shows a short retention time, less than 10 years. Accordingly, these memory devices, when used for the semiconductor storage device of the present invention, makes it possible to largely reduce the power consumption while the memory section is in the standby mode. With the memory film thinned, the short-channel effect is suppressed and memory devices can be made further minute.

(Sixth Embodiment)

Figure 12:
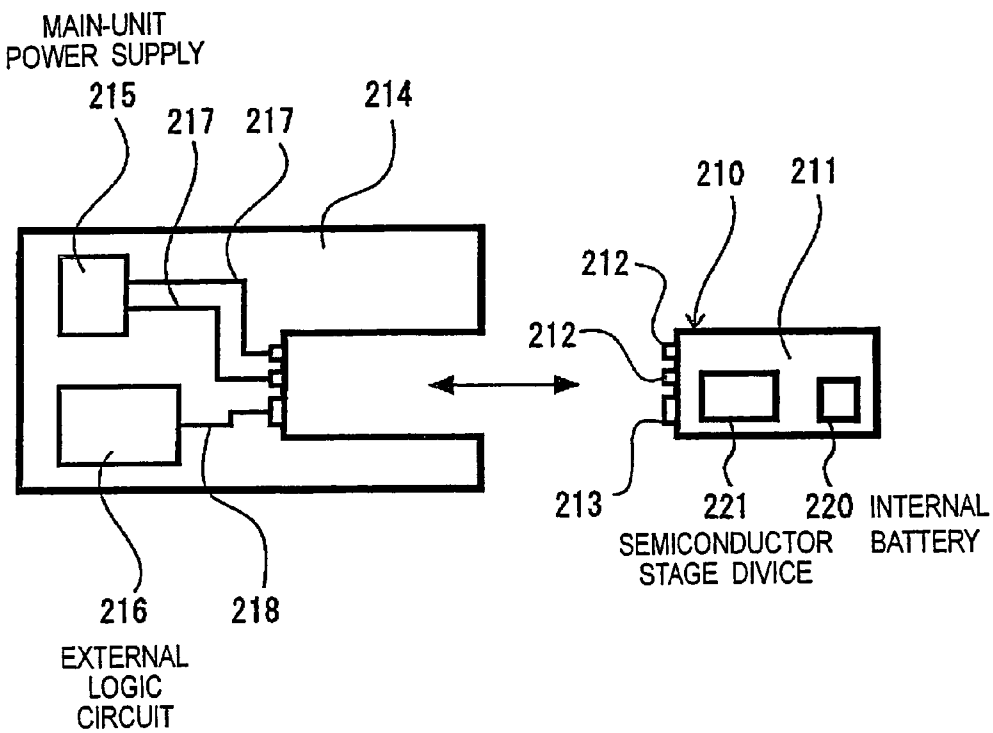
FIG. 12 is a view showing the construction of portable electronic equipment of a sixth embodiment of the invention.

Portable electronic equipment of a sixth embodiment of the present invention is described with reference to FIG. 12. The portable electronic equipment of this embodiment is so formed that a removable storage device 210 on which any one of the semiconductor storage devices of the foregoing first to fifth embodiments is mounted is incorporated into a portable electronic equipment main unit 214.

When the storage device 210 is incorporated into the battery-driven portable electronic equipment (cellular phone, personal digital assistant, portable game equipment, video camera, music player, etc.) main unit 214 as shown above, the power consumption of the memory section can be largely reduced while the equipment is in the standby mode, thus making it possible to prolong the battery life to a large extent.

Figure 3:
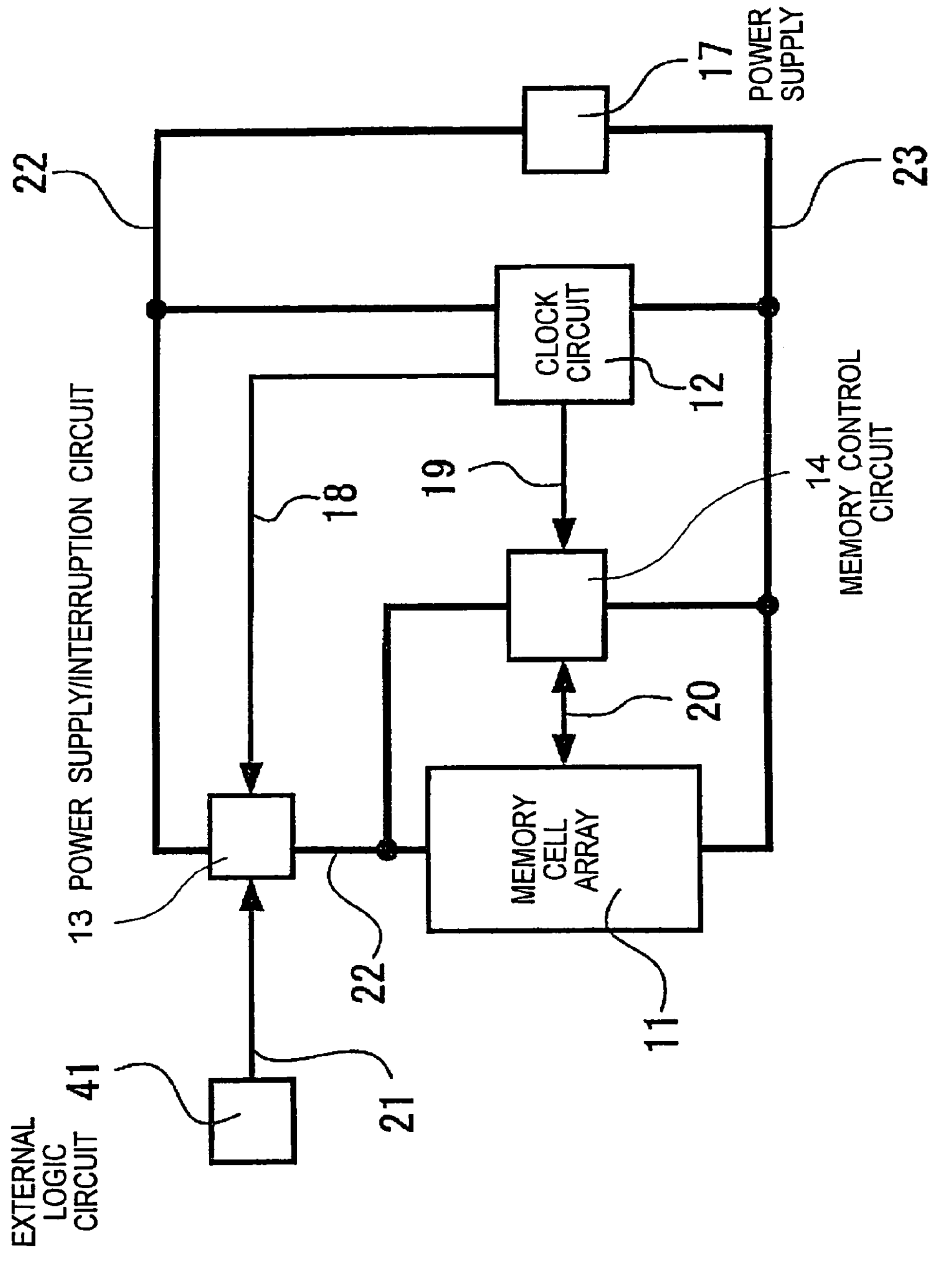
FIG. 3 is a view showing the construction of the semiconductor storage device of a second embodiment of the invention.
Figure 4:
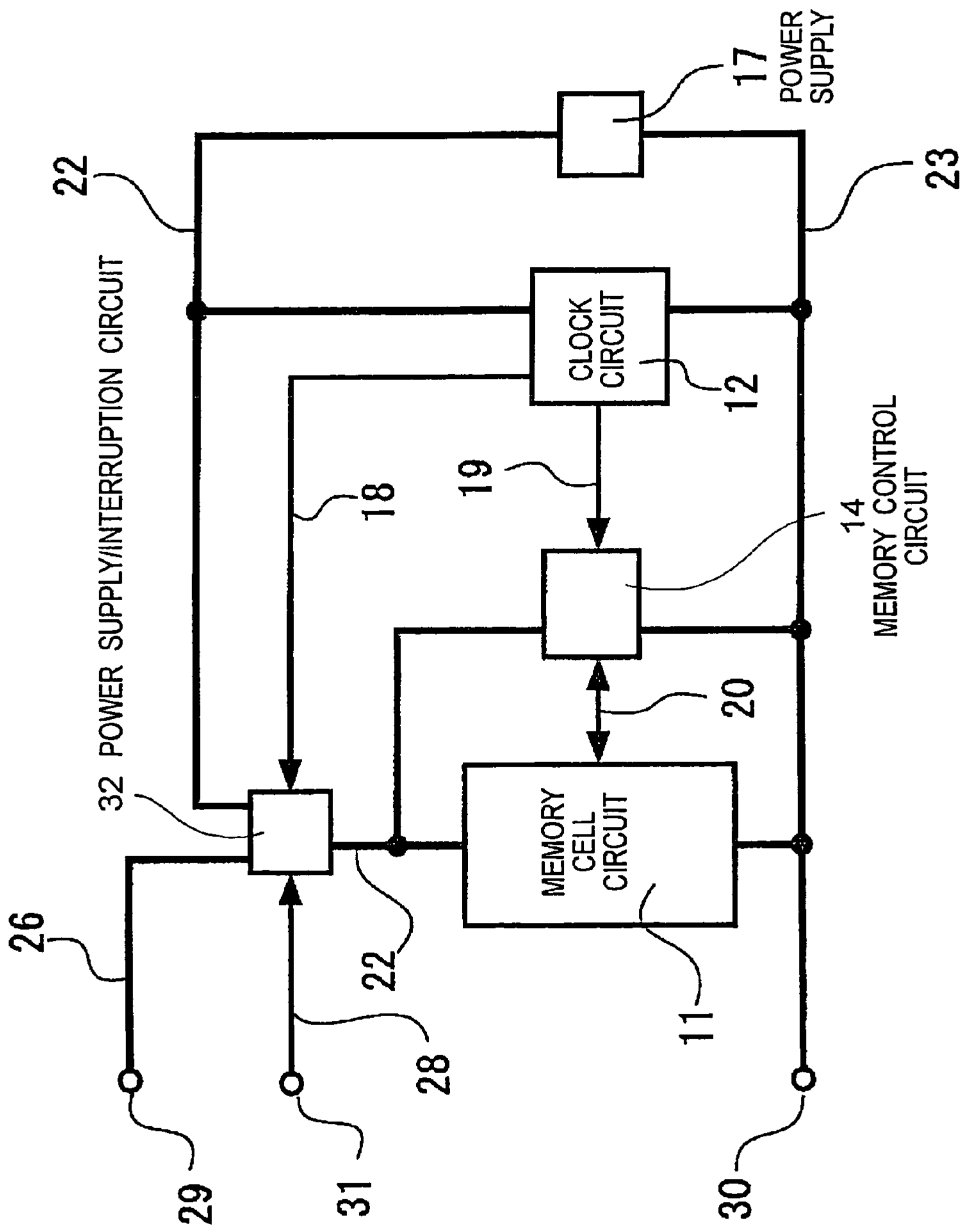
FIG. 4 is a view showing the construction of a semiconductor storage device of a third embodiment of the invention.

In this embodiment, a base member 211 of the storage device 210 contains a semiconductor storage device 221 shown in any one of FIGS. 2 to 4, and a battery 220 as a power supply for the semiconductor storage device 221. Further, power supply terminals 212 and a terminal 213 for transmission and reception of data are attached to the base member 211. The portable electronic equipment main unit 214, on the other hand, contains power supply lines 217 and a main-unit power supply 215 connected thereto, as well as a data bus 218 and an external logic circuit 216 such as an MPU connected thereto.

Even in a state that the storage device 210 is removed from the portable electronic equipment main unit 214, the semiconductor storage device 221 mounted on the base member 211 is powered from the internal battery 220, so that the semiconductor storage device 221 is enabled to retain stored data. In this case, since the memory section is not powered during the periods between a refresh operation and another refresh operation, the life of the internal battery 220 can be prolonged.

Also, when the storage device 210 is mounted on the portable electronic equipment main unit 214, the semiconductor storage device 221 mounted on the base member 211 can be powered from the main-unit power supply 215, so that consumption of the battery 220 contained in the base member 211 can be suppressed to a minimum. Further, when this removable storage device 211 is used in common among a plurality of units of electronic equipment, data sharing can be implemented.

According to the portable electronic equipment of this embodiment, the power consumption of the memory section can be largely reduced while the equipment is in the standby mode (i.e., the memory section is in the standby mode), thus making it possible to prolong the battery life to a large extent. Further, whereas nonvolatile memories in general have a problem of longer write and erase time, the use of, for example, the memory device of the fifth embodiment makes it possible to increase the operating speed of the equipment by shortening the write and erase time. Furthermore, when the removable storage device of the present invention is used in common among a plurality of units of electronic equipment, data sharing among the plurality of units of electronic equipment can be implemented.

What is claimed is:

1. A semiconductor storage device comprising:

a memory section that performs refresh operations;

a power supply/interruption circuit having a function of supplying or interrupting electric power to the memory section; and a terminal for receiving signals from an external clock circuit which generates timings of the refresh operations, wherein the memory section has operation modes of:

an active mode for performing at least one operation out of a write operation, an erase operation and a read operation in response to a request from an external logic circuit, and for performing a refresh operation during a period in which none of those operations is performed; and a standby mode for performing none of a write operation, an erase operation and a read operation based on a request from the external logic circuit but performing refresh operations alone, and wherein while the memory section is in the standby mode, the power supply/interruption circuit supplies electric power to the memory section only during periods in which a refresh operation is performed in synchronization with a timing of the refresh operation generated by the external clock circuit, and interrupts power supply to the memory section during periods in which the refresh operation is not performed.

2. A semiconductor storage device comprising:

a memory section that performs refresh operations;

a power supply/interruption circuit having a function of supplying or interrupting power to the memory section; and a clock circuit for generating timings of the refresh operations, wherein the memory section has operation modes of:

an active mode for performing at least one operation out of a write operation, an erase operation and a read operation in response to a request from an external logic circuit, and for performing a refresh operation during a period in which none of those operations is performed; and a standby mode for performing none of a write operation, an erase operation and a read operation based on a request from the external logic circuit but performing refresh operations alone, and wherein while the memory section is in the standby mode, the power supply/interruption circuit supplies electric power to the memory section only during periods in which a refresh operation is performed in synchronization with a timing of the refresh operation generated by the clock circuit, and interrupts power supply to the memory section during periods in which the refresh operation is not performed.

3. The semiconductor storage device as claimed in claim 2, wherein electric power to the memory section and the clock circuit is supplied from one power supply.

4. The semiconductor storage device as claimed in claim 1, further comprising an external power supply terminal for receiving power supply from an external power supply.

5. The semiconductor storage device as claimed in claim 4, further comprising a secondary battery which is charged with electric power supplied from the external power supply.

6. The semiconductor storage device as claimed in claim 1, wherein the memory section has a memory device which retains storage for not less than a time T without any refresh operation, the clock circuit or the external clock circuit generates timings of the refresh operations at a cycle shorter than the time T, and the time T is not less than $1\times10^{-3}$ second.

7. The semiconductor storage device as claimed in claim 2, wherein the clock circuit is formed of a complementary circuit which uses field effect transistors, and an absolute value of a power supply voltage with which the clock circuit is driven is smaller than an absolute value of a threshold value of the field effect transistors.

8. The semiconductor storage device as claimed in claim 1, wherein the memory section has a memory device which comprises a field effect transistor having a conductor film or semiconductor film as its floating gate, and an insulating film thickness between the conductor film or semiconductor film and a channel region of the field effect transistor is less than 10 nm, or an insulating film thickness between the conductor film or semiconductor film and a gate electrode of the field effect transistor is less than 10 nm.

9. The semiconductor storage device as claimed in claim 1, wherein the memory section has a memory device formed of a field effect transistor in which discrete dots formed of a conductor or semiconductor are used as a floating gate.

10. The semiconductor storage device as claimed in claim 1, wherein the memory section has a memory device of a field effect transistor type having a floating gate, and the floating gate is formed of a composite of a conductor film or semiconductor film and discrete dots of a conductor or semiconductor.

11. Portable electronic equipment which comprises the semiconductor storage device as defined in claim 1.

12. A removable storage device which comprises a base member which is removably mounted on an electronic equipment, wherein on the base member, the semiconductor storage device as defined in claim 1 is mounted, and a terminal for transmitting and receiving data with the electronic equipment is provided.

13. Portable electronic equipment which comprises the semiconductor storage device as defined in claim 2.

14. A removable storage device which comprises a base member which is removably mounted on an electronic equipment, wherein on the base member, the semiconductor storage device as defined in claim 2 is mounted, and a terminal for transmitting and receiving data with the electronic equipment is provided.

* * * * *